United States Patent
Uehara et al.

(10) Patent No.: US 7,692,495 B2
(45) Date of Patent: Apr. 6, 2010

(54) TUNABLE RF BANDPASS TRANSCONDUCTANCE AMPLIFIER

(75) Inventors: Gregory Uehara, Austin, TX (US); Brian Brunn, Austin, TX (US)

(73) Assignee: Marvell International Ltd., Hamilton (BM)

(*) Notice: Subject to any disclaimer, the term of this patent is extended or adjusted under 35 U.S.C. 154(b) by 0 days.

(21) Appl. No.: 12/045,468

(22) Filed: Mar. 10, 2008

(65) Prior Publication Data
US 2008/0218273 A1 Sep. 11, 2008

Related U.S. Application Data

(60) Provisional application No. 60/893,776, filed on Mar. 8, 2007.

(51) Int. Cl.
*H03F 3/04* (2006.01)
(52) U.S. Cl. .................. 330/305; 330/306
(58) Field of Classification Search .......... 330/305, 330/306, 69, 124 R, 295, 254
See application file for complete search history.

(56) References Cited

U.S. PATENT DOCUMENTS

| | | | |
|---|---|---|---|
| 4,617,523 A | 10/1986 | Taylor | |
| 5,434,538 A * | 7/1995 | Lee et al. | 330/84 |
| 5,434,541 A | 7/1995 | Knoedl, Jr. | |
| 6,316,970 B1 * | 11/2001 | Hebert | 327/67 |
| 6,433,637 B1 * | 8/2002 | Sauer | 330/255 |
| 6,985,707 B2 * | 1/2006 | Kasperkovitz | 455/234.1 |
| 2003/0007377 A1 | 1/2003 | Otaka | |

OTHER PUBLICATIONS

U.S. Appl. No. 12/018,933, filed Jan. 24, 2008 in the name of Gregory Uehara et al.

* cited by examiner

*Primary Examiner*—Henry K Choe

(57) ABSTRACT

Aspects of the disclosure can provide a bandpass transconductance amplifier that can include a minuend transconductance amplifier that converts a voltage signal to a first current and a subtrahend transconductance amplifier that converts the voltage signal to a second current having substantially the same amplitude as the first current but opposite polarity in both a first and a second stopband. The second current can have a substantially smaller amplitude than the first current in a passband. The disclosed bandpass transconductance amplifier can also include a controller that can tune the passband and the stopbands and a summing circuit that can add the first current and the second current.

25 Claims, 10 Drawing Sheets

TUNABLE RF BANDPASS TRANSCONDUCTANCE AMPLIFIER

INCORPORATION BY REFERENCE

This application claims the benefit of U.S. Provisional Application No. 60/893,776, "Tunable High-Q Transconductor for Bandpass RF Circuits" filed on Mar. 8, 2007, which is incorporated herein by reference in its entirety.

BACKGROUND

An amplifier can convert an input voltage signal to an output current signal, i.e., the amplifier can act as a transconductance and can be called a transconductance amplifier. The transconductance is the ratio of the output current signal to the input voltage signal.

The transconductance amplifier's transconductance, frequency response, impedance, noise, bias requirements, and many other amplifier characteristics are functions of the transistor semiconductor technology used. The semiconductor technologies that can be used for the transconductance amplifier can include bipolar junction transistor (BJT), junction field effect transistor (JFET), metal oxide semiconductor field effect transistor (MOSFET) technology, or complementary MOSFET (CMOS) technology.

A differential-input, differential-output transconductance amplifier can contain a differential pair of transistors. The voltage signal can be applied to the gates of two MOSFET transistors in the differential pair. Each transistor of the differential pair can generate a separate output current that can be nearly equal in magnitude and opposite in direction. One output current can flow into one transistor of the differential pair and another output current can flow out of the corresponding paired transistor. In other words, the two output currents can flow in antiphase, i.e., 180° out of phase, and can be regarded as a differential current.

For MOSFET technology, the source terminal of each transistor in the differential pair can be directly connected, thereby forming a source-coupled pair. Each corresponding drain terminal can provide an output current. For simplicity, MOSFET gate, source, and drain terminals are discussed in this disclosure rather than the equally applicable BJT base, emitter, and collector terminals, respectively. It is to be understood an input current signal into the base of the BJT develops an input voltage signal due to the input impedance at the base.

The two source terminals in the source-coupled pair can share a current sink that biases the pair. The current sink can be divided into two smaller, nearly identical current sinks each carrying half of the bias current of the single current sink. The two smaller current sinks can be connected in parallel so the two half currents add equally to the bias current obtained from a single current sink.

The gain and frequency response of a source-coupled pair can be modified by adding one or more degenerating impedances. A degenerating impedance can decrease the degenerated gain of an amplifier, such as a transconductance amplifier, by using a portion of the undegenerated gain for negative feedback. A degenerating impedance can improve the linearity of an amplifier and can impart frequency-selective characteristics to the transfer function of the amplifier. Frequency-selective characteristics may be described in terms of bands, which are ranges of a frequency variable.

Degenerating impedances can increase the range of input voltage over which the differential amplifier operates linearly. When two degenerating impedances are used to degenerate a differential pair of MOSFET transistors, each source terminal in the differential pair can drive a terminal of a degenerating impedance that is interposed between the source terminal and a single, common current sink.

A single degenerating impedance can be connected to the differential pair instead of two degenerating impedances. The single degenerating impedance can bridge or cross-couple the two source terminals. The common current sink can be replaced by two separate current sinks when a single degenerating impedance is used.

Each of the separate current sinks can connect to a separate source terminal of the differential pair. The separate current sinks can bias each transistor of the differential pair by drawing equal bias currents from the source terminals of each transistor. The bias currents can situate the two transistors in a linear range of operation without a DC voltage drop across the single degenerating impedances, which may then modify the transconductance gain and transconductance spectral shape of the differential amplifier.

SUMMARY

Aspects of this disclosure describe a bandpass transconductance amplifier that can include a minuend transconductance amplifier and a subtrahend transconductance amplifier that converts a voltage signal to a first and a second current, respectively. The second current can have substantially the same amplitude as the first current but be opposite in polarity in both a first and a second stopband. Further, the second current can have a smaller amplitude than the first current in the passband of the bandpass transconductance amplifier. The disclosed bandpass transconductance amplifier can also include a controller that can tune the passband and the stopbands and a summing circuit that can add the first current and the second current. The opposite phase relationship between the first and second currents can apply in the first and second stopbands and can attenuate the sum of the first and second currents in the stopbands.

The bandpass transconductance amplifier can further include a first degenerating impedance that degenerates the transconductance of the subtrahend transconductance amplifier. The bandpass transconductance amplifier may also include a second degenerating impedance that degenerates the transconductance of the minuend transconductance amplifier. The second degenerating impedance can attenuate the output current in the first stopband relative to the second stopband. The differential stopband attenuation can reduce interference from an interferer in the summed current.

The minuend and subtrahend transconductance amplifiers can be metal oxide semiconductor field effect transistor (MOSFET) amplifiers. The minuend and subtrahend transconductance amplifiers can be differential pair amplifiers.

According to the disclosure, the first degenerating impedance, i.e., the degenerating impedance of the subtrahend transconductance amplifier, can be a quadrature passive mixer filter (QPMF). The QPMF may also be called a frequency translatable impedance structure (FTI). The QPMF can further include a baseband impedance that can attenuate frequencies above a lowpass roll-off frequency and a set of mixer switches that can upconvert the baseband impedance to a tuned passband impedance. In other words, the baseband impedance can implement a baseband filter that can be translated to a passband impedance or passband filter having the passband filter impedance. The mixer switches in the QPMF may each have a finite ON resistance. In other words, each mixer switch can be a non-ideal, resistive switch.

The baseband impedance in the QPMF can be a parallel circuit including a resistor and a capacitor or a parallel circuit including a resistor in one branch and a series circuit containing a capacitor and another resistor in another branch.

The bandpass transconductance amplifier can produce an output current from the summing circuit that is at least 10 dB smaller in the first and second stopbands than in the passband. In further aspects of this disclosure, the first current may be substantially inphase with the second current over the passband. In additional aspects of this disclosure, the second current may be more than 10 dB smaller than, i.e., below, the first current over the passband. In other words, the transfer function of the second current may exhibit an amplification notch with respect to the first current.

In additional aspects of this disclosure, the second degenerating impedance of the bandpass transconductance amplifier can substantially match the ON resistance of the mixer switches in the passband. Matched ON resistances can improve the attenuation of the summing circuit output current for frequencies in a stopband. The attenuation can be relative to the output current in the passband and can be expressed in decibels (dB).

The bandpass transconductance amplifier can include a controller that tunes the passband, the first stopband, and the second stopband. The bandpass transconductance amplifier may also include a minuend transconductance amplifier that converts a voltage signal to a first current and a subtrahend transconductance amplifier that converts the voltage signal to a second current. The second current can have substantially the same amplitude as the first current but opposite polarity for frequencies in the first stopband and the second stopband. The second current can have a smaller amplitude than the first current within the passband.

The bandpass transconductance amplifier can also include a first degenerating impedance that degenerates the gain of the subtrahend transconductance amplifier. The degenerating impedance can be a quadrature passive mixer filter containing a baseband impedance that attenuates frequencies above a roll-off frequency and mixer switches that translate or upconvert the baseband channel impedance to a tuned passband impedance. The tuned passband impedance can have substantially the same spectral shape as the baseband impedance. The first and second currents can be added or summed by a summing circuit to generate an output current.

Aspects of this disclosure can also provide a method for bandpass amplification. The method can include converting a voltage signal to a first current and a second current, the second current having substantially the same amplitude as the first current, but opposite polarity over a first and a second stopband. The second current can have a smaller amplitude than the first current within a passband. In further aspects of this disclosure, the passband, first stopband, and second stopband may be tuned. In other words, the tuned passband may provide for a tunable bandpass amplifier. The first current and the second current may be added together to generate an output current.

In additional aspects of this disclosure, the transconductance of the subtrahend transconductance amplifier may be degenerated, i.e., the gain of the subtrahend transconductance amplifier may be reduced by negative feedback. The gain of the minuend transconductance amplifier may also be modified by degenerating, i.e., feeding back, a portion of the minuend transconductance amplifier gain.

The disclosed method can allow for degenerating the minuend transconductance amplifier gain. The degeneration steps can cause a significant attenuation of the output current in the first stopband relative to the second stopband. In further aspects of this disclosure, negative feedback from a quadrature passive mixer filter to the subtrahend transconductance amplifier, i.e., degeneration, reduces the transconductance of the subtrahend transconductance amplifier. The negative feedback steps of the method can further include upconverting a baseband impedance to a tuned passband impedance based on a clock signal. The tuned passband impedance can have substantially the same spectral shape as the baseband impedance. A portion of two source currents, i.e., each current being from a transistor terminal in the subtrahend transconductance amplifier, can pass through the tuned passband impedance to generate the negative feedback.

The disclosed method can also provide aspects in which the output current in the first and second stopbands can be at least 10 dB smaller than the output current in the passband. In addition, the first current can be substantially inphase with the second current over the passband.

In further aspects of this disclosure, the process of degenerating the transconductance of the subtrahend transconductance amplifier can reduce one or more non-linearities of the subtrahend transconductance amplifier. The reduction of non-linear effects can occur within the passband. Frequencies in the passband may occur in a notch of the subtrahend transconductance amplifier. Non-linear effects, such as mixer inter-modulation products, which predominate near the frequency that clocks the mixer, can be reduced or attenuated when the subtrahend transconductance amplifier implements a tunable notch or band-stop amplifier.

The minuend transconductance amplifier may be degenerated, i.e., the gain may be reduced by negative feedback, by matching the degeneration of the subtrahend transconductance amplifier in the stopband. In other words, for frequencies in the stopband, the degenerating impedance in the minuend transconductance amplifier may equal the impedance that degenerates the subtrahend transconductance amplifier. Matched degenerating impedances can enhance the attenuation in a stopband.

The disclosed method of bandpass amplification can include converting a voltage signal to a first current and a second current using a tunable subtrahend transconductance amplifier. The second current can have nearly the same amplitude as the first current but nearly 180° phase change over a first and a second stopband. The second current can be substantially smaller in amplitude than the first current within the passband of the amplifier. The transfer function for the gain or transconductance of the tunable subtrahend transconductance amplifier can be tuned in frequency based on a clock signal and the output of the bandpass amplification method can be generated by adding the first and second currents.

BRIEF DESCRIPTION OF THE DRAWINGS

The disclosure will refer to the accompanying figures, wherein like numerals represent like elements, and wherein.

DETAILED DESCRIPTION OF EMBODIMENTS

Figure 1A:
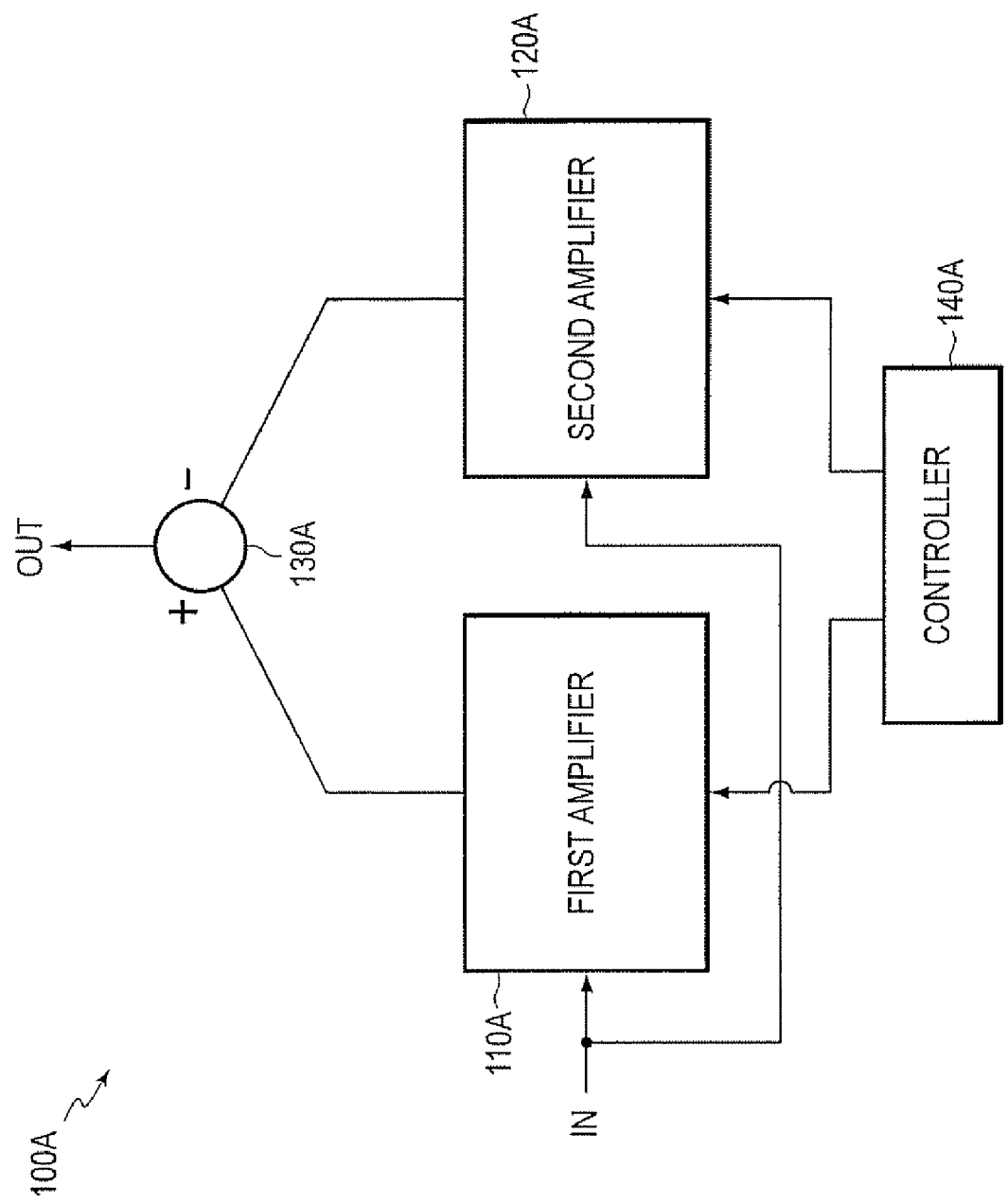
FIG. 1A shows a diagram of an exemplary tunable bandpass amplifier (TBA)

FIG. 1A shows a diagram of an exemplary tunable bandpass amplifier (TBA) 100A that can include a first amplifier 110A, a second amplifier 120A, a summing circuit 130A, and a controller 140A. The first and second amplifiers 110A-120A can receive an input signal from an external source (not shown) and can each receive a control signal from the controller 140A.

The first and second amplifiers 110A-120A can be inverting amplifiers, non-inverting amplifiers, single ended amplifiers, differential amplifiers, voltage amplifiers, transimpedance amplifiers, transconductance amplifiers, and the like.

The first and second amplifiers 110A-120A may amplify the input signal over a broad range of frequencies that includes one or more desired stop bands. The first and second amplifiers 110A-120A may amplify the input signal by approximately the same amplification factor and may shift the phase of the signal by approximately the same phase shift over a given stop band.

The summing circuit 130A can subtract the output of the second amplifier 120A from the output of the first amplifier 110A. The attenuation of the stopband or stopbands can be determined by the closeness of the amplitude and the phase of the first and second amplifiers 110A-120A.

The controller 140A can supply control and clock signals to the first and second amplifiers 110A-120A. For example, the controller 140A can set or adjust an amplifier gain and phase in the first amplifier 110A to match the gain and phase of the second amplifier 120A in one or more stop bands.

Figure 1B:
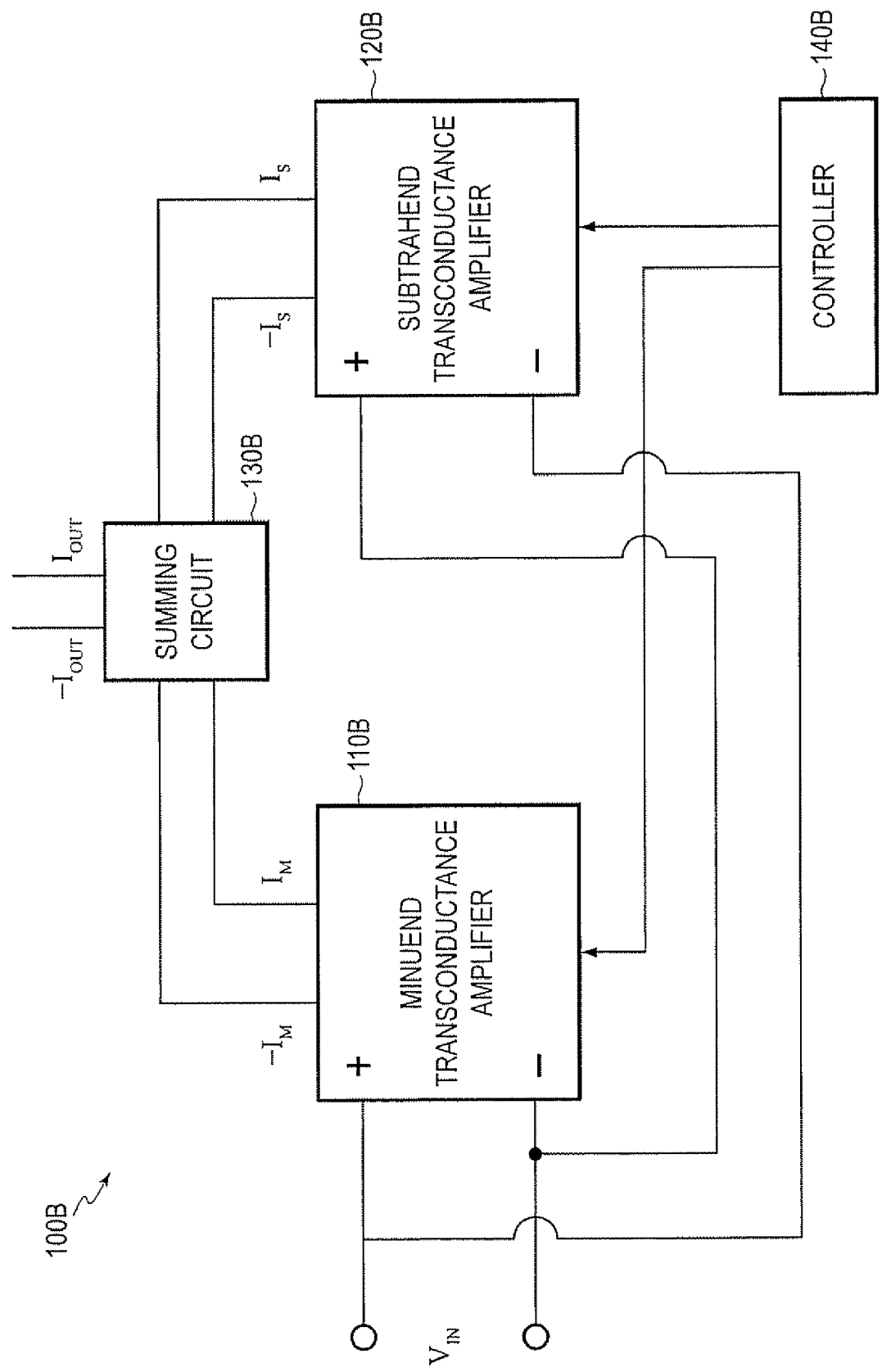
FIG. 1B is a diagram of an exemplary tunable bandpass transconductance amplifier.

FIG. 1B contains a diagram of an exemplary tunable bandpass transconductance amplifier 100B. As shown, the transconductance amplifier 100B can include a minuend transconductance amplifier 110B, a subtrahend transconductance amplifier 120B, a summing circuit 130B, and a controller 140B.

The minuend transconductance amplifier 110B can receive a voltage signal $V_{IN}$ across two input terminals, a non-inverting and an inverting terminal, and a set of control and clock signals from controller 140B. The minuend transconductance amplifier 110B can output both a minuend path current $I_M$ and the negative of the minuend path current $-I_M$ to the summing circuit 130B. The two minuend path currents can be described as a minuend differential current or simply as the minuend current.

The subtrahend transconductance amplifier 120B can receive the input signal $V_{IN}$ and a set of control and clock signals from controller 140B. The input voltage signal $V_{IN}$ can be received with an opposite polarity or antiphase to that of the minuend transconductance amplifier 110B. The subtrahend transconductance amplifier 120B can output both a subtrahend path current $I_S$ and the negative of the subtrahend path current $-I_S$ to summing circuit 130B. The two subtrahend path currents can be described as a subtrahend differential current or simply as the subtrahend current.

Summing circuit 130B can sum or add the minuend current and the subtrahend current and generate a summed output current $I_{OUT}$. Alternatively, summing circuit 130B can subtract the subtrahend current from the minuend current if the same polarity of the input signal is applied to both the minuend transconductance amplifier 110B and the subtrahend transconductance amplifier 120B.

The minuend transconductance amplifier 110B and the subtrahend transconductance amplifier 120B can each respond to an input voltage signal $V_{IN}$ by generating a minuend and subtrahend current signal, respectively. Each current signal can be described as a two nearly equal currents flowing in opposite directions or as a differential current. The output current signals can each be related to the input voltage signal by a frequency dependent transfer function.

The transfer function of each transconductance amplifier 110B, 120B can be distinct. For example, the minuend transconductance amplifier 110B can have an allpass transfer function, i.e., it can be flat or independent of frequency, while the subtrahend transconductance amplifier can have a notch, band-reject, or band-stop transfer function. The center frequency of passband of the notch and the spectral shape of the notch may be tuned by the controller 140B. The subtrahend transconductance amplifier can be a programmable notch amplifier. Non-linearities in the transconductance of a transconductor amplifier, such as the non-linearities that may be generated by a frequency tunable impedance (FTI) or a quadrature passive mixer filter (QPMF), can be reduced, relative to the case when no mixer is present, for frequencies within the notch.

An FTI can include clock switches, a frequency selective impedance, and a clock generator. The frequency selective impedance can implement a filter function. For example, the frequency selective impedance can low pass filter or high pass filter signals. The FTI can translate the baseband impedance or the impedance of the low pass characteristic to a bandpass characteristic centered at the clock generator frequency. The FTI can translate the high pass characteristic to a bandstop characteristic centered at the clock generator frequency. The clock signals from the controller 140A strobe or switch mixing elements, clock switches, tune a frequency of a frequency tunable impedance (FTI), and the like. An FTI is described in greater detail in U.S. application Ser. No. 12/018,933, "Frequency and Q-Factor Tunable Filters using Frequency Translatable Impedance Structures" filed on Jan. 24, 2008, which is incorporated herein by reference in its entirety.

An overall bandpass transfer function can result when a band-stop transfer function is subtracted from an allpass transfer function. A bandpass transfer function may be used in wideband CDMA, Bluetooth, WIFI and other applications, including transceivers, bandpass low noise amplifiers (LNAs), tuned amplifiers, tuned transconductance amplifiers, receive chain amplifiers, transmit chain amplifiers, blocking amplifiers, and the like.

The frequency dependence of the overall transconductance amplifier, i.e., the overall transfer function, can be designed to reduce stopband noise, interferers, inter-modulation distortion, and the like. The overall transfer function can also be designed to reject image bands and enhance the signal to noise ratio of the output current signal $I_{OUT}$. The poles and zeros of the overall transfer function can be placed in the complex frequency domain, i.e., in the complex plane given by a Laplace variable, at positions that accomplish these design objectives. For example, the overall transfer function may include zeros in the complex plane that null, attenuate or diminish the effect of interferers such as blocking signals or blockers. One or more degenerating impedances can place zeros to increase the attenuation of the output current in a first stopband relative to a second stopband. The asymmetrical attenuation can occur in a portion of the first stopband and can significantly attenuate blocking signals or interferers.

The overall transconductance transfer function can be a bandpass filter with a passband and two stopbands. The passband can be a band of frequencies in which the amplitude of the output current is substantially larger than in the stopbands. The amplitude of the signal is the magnitude of the signal without regard to sign or phase. The overall transconductance transfer function can have multiple passbands and stopbands. The center frequency and spectral shape of any passband can be selected, tuned, or programmed by controller 140B. The stopbands may or may not be tuned when a passband is tuned; the tuned passband being interposed between two tuned stopbands. A passband may also be tuned at the expense of a transition band interposed between the passband and a stopband. In other words, a passband roll-off rate may be adjusted when a passband is tuned.

The poles and zeros of the overall transconductance transfer function can be apportioned to the minuend transconductance amplifier 110B, the subtrahend transconductance amplifier 120B, or both. Controller 140B can select and adjust the apportionment of poles and zeros and can tune the center frequency of one or more clock signals to achieve an overall transconductance transfer function. Controller 140B can decompose or divide an overall transconductance transfer function into portions that can be assigned to and implemented by the minuend transconductance amplifier 110B and the subtrahend transconductance amplifier 120B. For each transconductance amplifier 110B and 120B, the controller 140B can select and adjust any spectral shaping parameter or other amplifier parameter, such as amplifier gain and phase response.

The overall transconductance transfer function can depend on a set of filter and mixer parameters. The filter and mixer parameters can be determined by a filter design methodology that obeys the circuit topology, e.g., the differencing structure, of the tunable bandpass transconductance amplifier 100B. The filter and mixer parameters and one or more clock frequency or center frequency, such as $f_{CENTER}$, can be tuned by controller 140B.

A bandpass transfer function can be an advantageous choice for the overall transconductance transfer function. A bandpass filter can reduce stopband noise, reduce interferers, such as blocking signals, reject image bands, reduce intermodulation distortion, and enhance the signal to noise ratio. An overall bandpass characteristic can be obtained from a data-driven design methodology. The data, an RF signal that can include noise and interferers, can be autocorrelated and the autocorrelogram can be Fourier transformed to form a power spectral density or PSD. The PSD can be factored to determine pole and zero placements according to the principles of spectral factorization. Other filter design methodologies that use the disclosed circuit topology can also produce solutions to the problem of determining the desired overall transconductance transfer function. Suitable filter design methodologies can include least mean square parameter estimation, conjugate gradient, downhill simplex, direction set, variable metric methods, simulated annealing, and the like.

The minuend transconductance amplifier 110B and the subtrahend transconductance amplifier 120B can be differential amplifiers with degenerating impedances. The frequency dependence of the degenerating impedances can be derived once the set of parameters of the overall transconductance transfer function is determined, i.e., the placement of poles and zeros and the center frequency or frequencies. For example, if the transfer function of the minuend transconductance amplifier 110B is $g_M(s)$, where s is the Laplace variable, and the minuend path transconductance transfer function is:

$$g_M(s) = \frac{g_{M0}}{1 + c \cdot g_{M0} \cdot Z_M(s)} \quad \text{EQ. 1}$$

where $g_{M0}$ is the direct current (DC) transconductance of the minuend transconductance amplifier 110B in the absence of a degenerating impedance and c is a constant, such as c=½. In this case, the minuend path degenerating impedance, $Z_M(s)$, can be given by:

$$Z_M(s) = \frac{1}{c \cdot g_M(s)} - \frac{1}{c \cdot g_{M0}} \quad \text{EQ. 2}$$

For the disclosed filter topology, the design methodology for the overall transfer function and its partitioning to individual transconductance amplifiers can be described as oppositional spectral shaping. Oppositional spectral shaping can substantially attenuate or cancel noise in the stopbands when the transfer function of the minuend transconductance amplifier 110B and the subtrahend transconductance amplifier 120B are closely matched. A matching fidelity or canceling criterion in the stopband can be used to determine the stopband attenuation of the noise and interference. For example, the minuend transconductance amplifier 110B and the subtrahend transconductance amplifier 120B can have transconductance transfer functions that are substantially equal but have opposite polarity in one or more stopbands; the resulting cancellation can attenuate out-of-band interference and noise. The resulting attenuation may be expressed in decibels (dB). The minuend transconductance amplifier 110B and the subtrahend transconductance amplifier 120B can have substantially different transconductance transfer functions in one or more passbands of the overall transconductance transfer function.

A passband can be tuned to a given center frequency by controller 140B by using a clock signal. The clock signal may have a frequency or a passband center frequency $f_{CENTER}$. The passband center frequency can be a radio frequency or RF frequency such as 1 GHz. The ratio of a center frequency divided by a passband bandwidth can be called the quality factor or Q factor of the bandpass filter. A high Q factor can allow tunable transconductance amplifier 100B to reject interference or interfering signals and out-of-band noise.

Figure 1C:
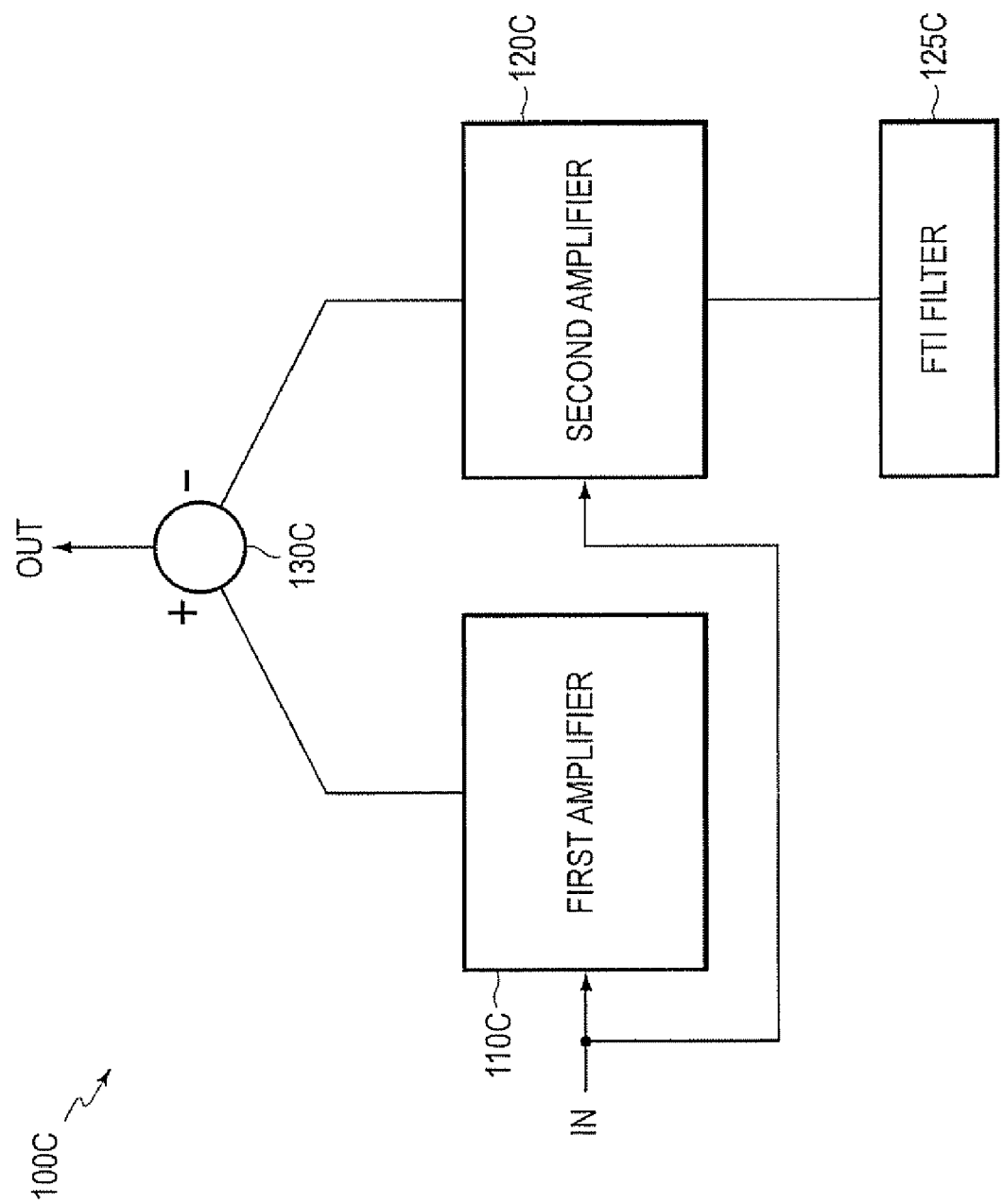
FIG. 1C shows a diagram of an exemplary TBA.

FIG. 1C shows a diagram of an exemplary tunable bandpass amplifier (TBA) 100C that can include a first amplifier 110C, a second amplifier 120C, a summing circuit 130C, and a FTI 125C. The first and second amplifiers 110C-120C can receive an input signal from an external source (not shown) and can each receive a control signal from a controller (not shown), such as controller 140A or controller 140B. Other elements of FIG. 1C can perform similar functions as corresponding elements of TBA 100A.

The second amplifier 120C may be coupled to an FTI 125C. The FTI 125C can be described as a filter or as an filter impedance. The FTI 125C can be described as a lowpass or highpass filter and can be clocked by an internal clock generator that is included in the FTI 125C. The FTI 125C may receive the clock signal from a controller, such as controller 140A. The clock signal may oscillate at a desired bandpass or bandstop frequency. The FTI 125 may be a baseband impedance, a lowpass impedance, or a corresponding lowpass filter characteristic, that is translated to be centered on the desired bandpass frequency. For example, the FTI 125 can include frequency selective impedance elements, clockable switches, and a clock generator or a clock receiving circuit that opens and closes the clockable switches at a desired bandpass or bandstop frequency. The controller (not shown) can determine the desired frequency.

Figure 1D:
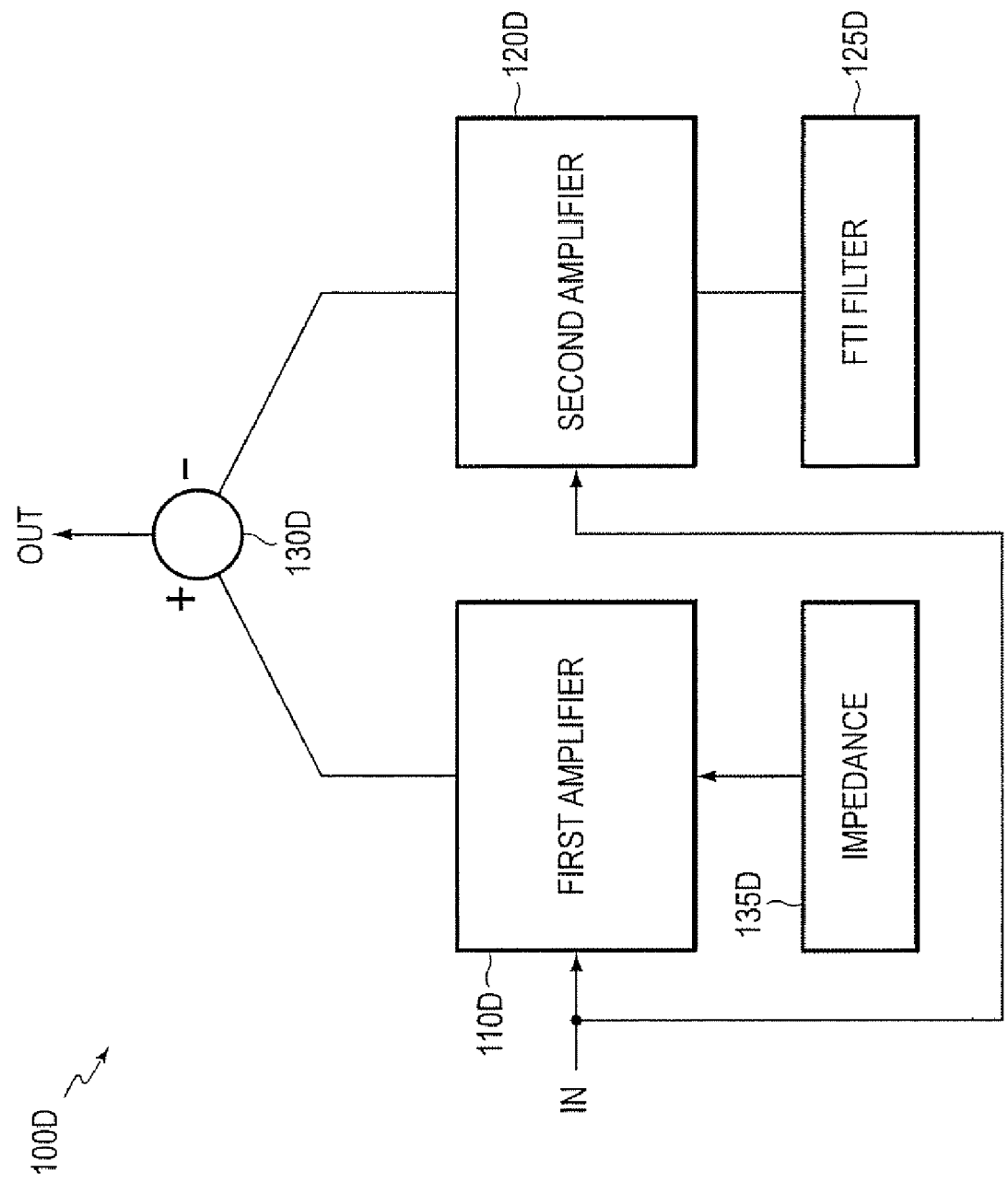
FIG. 1D shows a diagram of an exemplary TBA.

FIG. 1D shows a diagram of an exemplary tunable bandpass amplifier (TBA) 100D that can include a first amplifier 110D, a second amplifier 120D, a summing circuit 130D, a FTI 125D, and a dummy impedance 135D. The first and second amplifiers 110D-120D can receive an input signal from an external source (not shown) and can each receive a control signal from a controller (not shown), such as controller 140A or controller 140B. Other elements of FIG. 1D can perform similar functions as corresponding elements of TBA 100C.

The first amplifier 110D may be coupled to the dummy impedance 135D. The dummy impedance 135D can match the impedance of clocked switches in the FTI 125D. For example, the dummy impedance 135D can compensate for parasitic impedances in the FTI 125D that could otherwise raise the stop band characteristics of the TBA 100D. In other words, the attenuation a stop band of TBA 100D can increase when the dummy impedance improves the match of the first and second amplifiers 110D-120D such that the summing circuit 130D can produce nearly complete cancellation of the amplified signals at a range of frequencies or a desired stop band.

Figure 2:
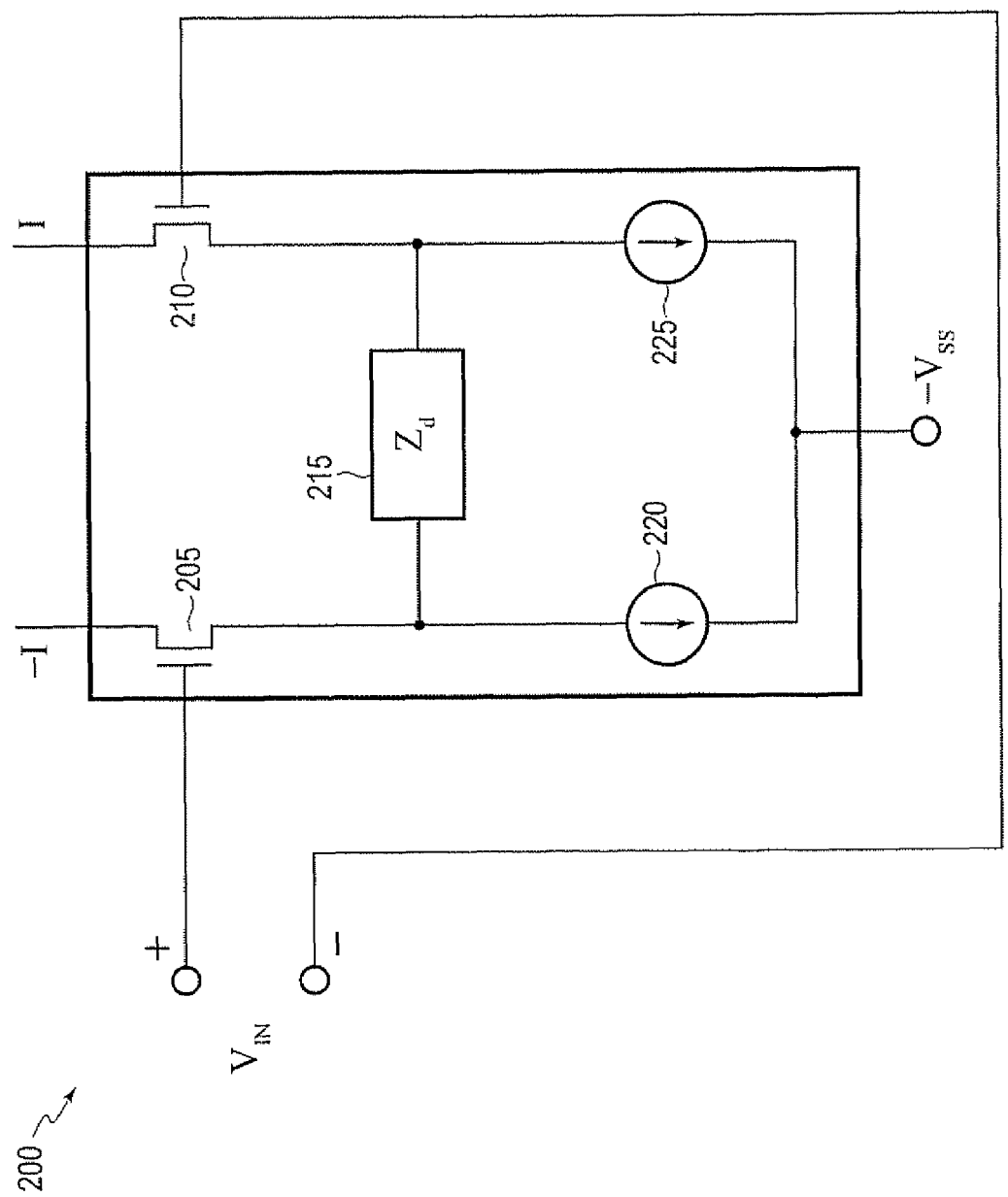
FIG. 2 shows a diagram of an exemplary differential input/differential output transconductance amplifier with a degenerating impedance.

FIG. 2 shows a diagram of an exemplary differential transconductance amplifier 200. The differential transconductance amplifier 200 can include transistors 205 and 210, a degenerating impedance 215, and current sinks 220 and 225. The gates of transistors 205 and 210 can be the inverting and non-inverting terminals of transconductance amplifier 200, respectively. When the degenerating impedance 215 is zero, transistors 205 and 210 can be considered a source-coupled pair. For the case of MOSFET technology, the drain current from transistor 205 can be denoted −I and the drain current from transistor 210 can be denoted I.

The degenerating impedance 215 can be denoted $Z_d$ and can be both frequency-dependent and tunable by a controller, such as controller 140. In other words, degenerating impedance 215 can contain passive resistances, active resistances, such as triode bias transistors, and passive reactive elements, such as capacitors and/or inductors. $Z_d$ can also contain active elements such as MOSFET switches or digital mixers. Both the passive and active elements of degenerating impedance 215 can be adjusted or tuned and can be driven with one or more frequencies from a local oscillator or clock signal supplied by a controller, such as controller 140.

The degenerating impedance 215 can provide feedback to and thus degenerate, or reduce the gain, by means of negative feedback, of transistors 205 and 210. The degenerating impedance 215 can degenerate the transconductance of an amplifier, such as the minuend transconductance amplifier 110 and subtrahend transconductance amplifier 120. The degenerating impedance 215 can modify the transfer function of a transconductance amplifier according to the form of EQ 1. Two transconductance amplifiers 200, which have separate degenerating impedances and DC transconductances and which operate with opposite polarity, can achieve an overall transconductance, $g_T(s)$, according to by EQ. 3. In EQ. 3, $g_{s0}$ and $Z_s(S)$ can denote the DC transconductance and the degenerating impedance of a subtrahend transconductance amplifier such as subtrahend transconductance amplifier 120.

$$g_T(s) = \frac{g_{M0}}{1 + c \cdot g_{M0} \cdot Z_M(s)} - \frac{g_{S0}}{1 + c \cdot g_{S0} \cdot Z_S(s)} \qquad \text{EQ. 3}$$

The degenerating impedance 215 used in the subtrahend transconductance amplifier 120 can be a quadrature passive mixer filter, or QPMF. A QPMF can translate a baseband impedance to a higher frequency, i.e., upconvert a baseband impedance to a tuned impedance. The baseband impedance, which can be a lowpass filter impedance having a lowpass roll-off frequency, can be upconverted to a center frequency denoted by $f_{CENTER}$, based upon a clock signal In other words, the QPMF can generate a passband impedance, such as degenerating impedance 215, from a baseband impedance.

The clock signal used by the QPMF can contain several clock phases such as non-overlapping, four phase clocks with 25% duty cycle each or it can contain two quadrature clock signals and their complements. A controller, such as controller 140, can supply the clock signal. Degenerating impedance 215 can be a short circuit so that transconductance amplifier 200 can behave as an allpass amplifier. Degenerating impedance 215 can be a lowpass filter so that transconductance amplifier 200 can behave as a notch filter amplifier. When degenerating impedance 215 is a lowpass filter, the transconductance amplifier 200 can behave as a tunable notch transconductance amplifier. Nonlinear effects, such as a second order intercept or IP2, which may be caused by the mixers used in a QPMF, can be attenuated when the QPMF degenerates a transconductance amplifier and forms a tunable notch transconductance amplifier.

The following example can illustrate a method of designing a tunable bandpass filter for the overall tunable bandpass transconductance amplifier transfer function based upon the principles of this disclosure. First, a prototype or generic lowpass filter with a Laplace or s-domain transfer function, LP(s), can be given by:

$$LP(s)=1/(1+\alpha s) \qquad \text{EQ. 4,}$$

where the $\alpha$ parameter can be related to the lowpass cutoff frequency, $f_c$ by:

$$f_c=1/(2\pi\alpha). \qquad \text{EQ. 5}$$

A baseband to passband transformation, i.e., $s \rightarrow (s^2+\omega_0^2)/s$, can be used to center the lowpass transfer function on a radian center frequency $\omega_0=2\pi f_{CENTER}$, i.e., the radian frequency for which the bandpass characteristic is at a peak. The baseband to passband transformation can be implemented by degenerating impedance that is a QPMF. The center frequency $f_{CENTER}$, can be supplied by one or more clock phases from a controller, such as controller 140. The transfer function of the bandpass filter can be denoted, BP(s) and can obey the following relation:

$$BP(s) = \frac{s/\alpha}{s^2 + s/\alpha + \omega_0^2} = \frac{2\varsigma \cdot \omega_0 s}{s^2 + 2\varsigma \cdot \omega_0 s + \omega_0^2} \qquad \text{EQ. 6}$$

where the damping factor, $\varsigma$, can be inversely proportional to a quality factor, Q. The damping factor can be related to the radian center frequency and $\alpha$ parameter according to:

$$\varsigma = 1/(2\alpha \cdot \omega_0) = \frac{1}{2Q} \qquad \text{EQ. 7}$$

A minuend transconductance amplifier, such as minuend transconductance amplifier 110, can be an allpass amplifier with a transconductance, $g_{M0}$, that matches the un-degenerated transconductance, $g_{S0}$, of a subtrahend transconductance amplifier, such as such as the subtrahend transconductance amplifier 120. In this case, the degenerating impedance of the minuend transconductance amplifier can be small, ideally zero, i.e., $Z_M(s)=0$ and, since $g_{M0}=g_{S0}$, the overall transconductance can be given by:

$$g_T(s) = g_{S0}\left(1 - \frac{1}{1 + c \cdot g_{S0} \cdot Z_S(s)}\right) = g_{PEAK} \cdot BP(s) \qquad \text{EQ. 8}$$

where c=½ and $g_{PEAK}$ is the peak of the overall transconductance transfer function. The parameter $g_{PEAK}$ can be a positive transconductance less than $g_{M0}$ or $g_{S0}$.

A solution to EQ. 4 can be given by:

$$Z_S(s) = \frac{g_{PEAK} \cdot BP(s)}{cg_{S0}^2 \cdot (g_{S0} - g_{PEAK} \cdot BP(s))} \qquad \text{EQ. 9}$$

For an exemplary bandpass transconductance transfer characteristic, the degenerating impedance of the subtrahend transconductance amplifier can be given as:

$$Z_S(s) = \frac{g_{PEAK}}{c \cdot g_{S0}^2} \frac{2\varsigma \cdot \omega_0 s}{cg_{S0} \cdot \left[s^2 + 2\varsigma \cdot \left(1 - \frac{g_{PEAK}}{g_{S0}}\right) \cdot \omega_0 s + \omega_0^2\right]} \qquad \text{EQ. 10}$$

EQ. 6 can indicate that the subtrahend transconductance amplifier's degenerating impedance, $Z_S(s)$, also has a bandpass characteristic but with a lower damping factor than that of the overall or desired bandpass transconductance. The Q factor of $Z_S$ can increase as the peak transconductance increases and the Q factor of the overall transfer function can be lower than the Q factor of $Z_S$.

The damping factor of the subtrahend transconductance amplifier's degenerating impedance can be denoted as σ. For this example, the σ parameter can be proportional to the damping factor of the overall transconductance according to the following definition:

$$\sigma = \varsigma \cdot \left(1 - \frac{g_{PEAK}}{g_{S0}}\right), \qquad \text{EQ. 11}$$

and the corresponding cutoff frequency of the lowpass filter can be given as:

$$f_c = \frac{\omega_0}{\pi} \cdot \varsigma \left(1 - \frac{g_{PEAK}}{g_m}\right). \qquad \text{EQ. 12}$$

EQ. 11 can be interpreted to show that the lowpass filter cutoff frequency can be reduced as the overall transconductance peak approaches $g_{S0}$. The lowpass filter cutoff frequency can be related to the bandpass bandwidth BW according to:

$$f_c = BW\left(1 - \frac{g_{PEAK}}{g_m}\right). \qquad \text{EQ. 13}$$

EQ. 13 indicates that as $g_{PEAK}$ increases, the lowpass filter cutoff frequency can decrease.

The minuend transconductance amplifier degenerating impedance, $Z_M(s)$, was taken to be zero in the previous exemplary case. A zero minuend degenerating impedance may not match the subtrahend degenerating impedance $Z_S(s)$ in the stopbands that flank the overall bandpass characteristic. This exemplary case may not provide adequate cancellation of noise and interference in the stopbands. In other words, a $Z_M$ can be set to a low impedance over the passband and can be set to match $Z_S$ over a significant portion of each stopband.

A prototype highpass impedance characteristic can be given by:

$$Z_{HP}(s) = Z_{M0}\beta \cdot s/(1+\beta \cdot s) \qquad \text{EQ. 14,}$$

and the resulting notched impedance can be given by:

$$Z_M(s) = Z_{M0} \frac{s^2 + \omega_0^2}{s^2 + s/\beta + \omega_0^2} = Z_{M0} \frac{s^2 + w_0^2}{s^2 + 2\mu \cdot \omega_0 s + \omega_0^2} \qquad \text{EQ. 15}$$

where the notch impedance damping factor, μ, in EQ. 15 can be adjusted so the notch bandwidth exceeds the bandpass filter bandwidth.

Figure 3B:
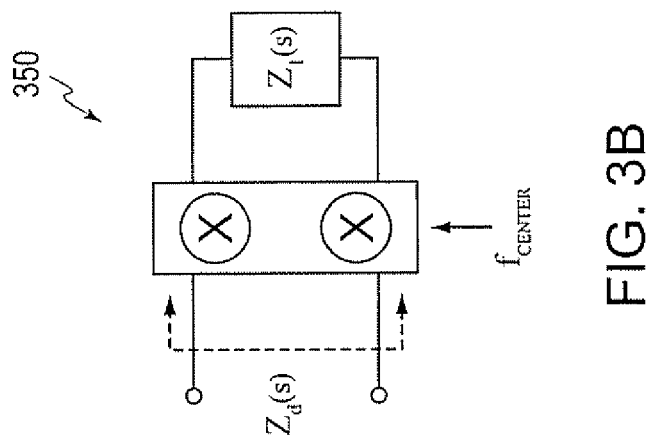
FIG. 3B shows a compact symbol for an exemplary quadrature passive mixer filter (QPMF)
Figure 3A:
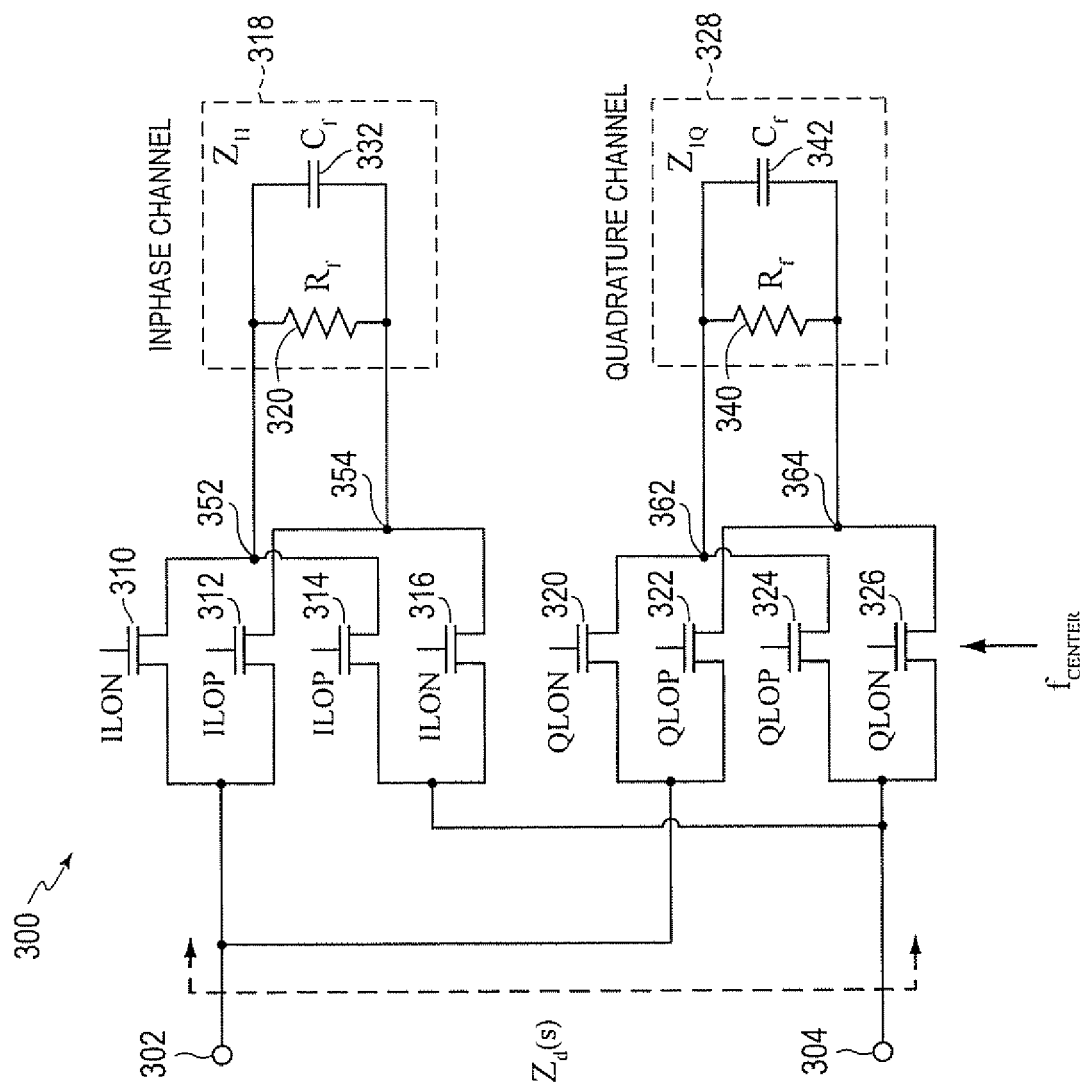
FIG. 3A shows a diagram of an exemplary quadrature passive mixer filter (QPMF)

FIG. 3A is a diagram of an exemplary quadrature passive mixer filter (QPMF) 300. The QPMF 300 can include inphase switches 310, 312, 314, and 316, quadrature switches 320, 322, 324, and 326, inphase channel impedance $Z_{1I}$ 318, and quadrature channel impedance $Z_{1Q}$ 328. Inphase channel impedances $Z_{1I}$ 318 and $Z_{1Q}$ 328 can closely approximate a common value $Z_1$ over a range of frequencies that include a signal passband and one or more stopbands. The inphase and quadrature channel impedances 318 and 328 can be described as baseband impedances for the inphase and quadrature channels of a complex impedance converter or frequency shifter.

The $Z_{1I}$ 318 and the $Z_{1Q}$ 328 can further include filter elements such as resistors 330 and 340 and capacitors 332 and 342 as the inphase and quadrature channel impedance, respectively. The $Z_{1I}$ 318 and the $Z_{1Q}$ 328 can also include additional passive elements such as inductors, nonlinear signal shaping elements, such as diode or transistor based soft limiters, or active elements such as operational amplifier based active filters, transistor amplifier-filters, or the like.

The QPMF 300 can present a degenerating impedance $Z_d(s)$ across input terminals 302 and 304. The terminal 302 can connect to a source or drain of inphase switches 310 and 312 and quadrature switches 320 and 322. The terminal 304 can connect to a source or drain of inphase switches 314 and 316 and quadrature switches 324 and 326.

A drain or source of inphase switches 310 and 314, which may not be connected to terminal 302, can connect to node 352 and to a first terminal of $Z_{1I}$ 318. A drain or source of inphase switches 312 and 316, which may not be connected to terminal 304, can connect to node 354 and to a second terminal of $Z_{1I}$ 318.

A drain or source of quadrature switches 320 and 324, which may not be connected to terminal 302, can connect to node 362 and to a first terminal of $Z_{1Q}$ 328. A drain or source of quadrature switches 322 and 326, which may not be connected to terminal 304, can connect to node 364 and to a second terminal of $Z_{1Q}$ 328.

The QPMF 300 can be provided with a clock or local oscillator (LO) signal, $f_{CENTER}$ and can operate in synchrony with the clock. The $f_{CENTER}$ clock signal can be a multi-phase clock such as a four phase clock including an inphase LO positive (ILOP) phase, an inphase LO negative (ILON) phase, a quadrature LO positive (QLOP) phase, and a quadrature LO negative (QLON) phase. The four clock phases can be 25% duty cycle, substantially non-overlapping clock pulses.

The inphase switches 310-316 and quadrature switches 320-326 can be switched closed or strobed at the frequency $f_{CENTER}$ of the clock signal. The ILOP clock phase can strobe inphase switches 312 and 314, thereby connecting terminal 302 to node 354 and simultaneously connecting terminal 304 to node 352. The QLOP clock phase can strobe quadrature switches 322 and 324, thereby connecting terminal 302 to node 364 and simultaneously connecting terminal 304 to node 362. The ILON clock phase can strobe inphase switches 310 and 316, thereby connecting terminal 302 to node 352 and simultaneously connecting terminal 304 to node 354. The QLON clock phase can strobe quadrature switches 320 and 326, thereby connecting terminal 302 to node 362 and simultaneously connecting terminal 304 to node 364. Each of the connections between a terminal, such as terminal 302 or 304 to a node, such as node 352, 354, 362, or 364 can include a switch resistance, such as a switch ON resistance. In other words, each inphase or quadrature switch 310-326 can include a series ON resistance that modifies the impedance presented between terminals 302 and 304.

FIG. 3A also shows a simplified symbol for QPMF 300 in which the clock signal, $f_{CENTER}$, strobes or mixes a pair of complex mixers. The complex, quadrature mixing operation can translate the impedance of a complex channel filter, such as a baseband impedance $Z_1(s)$, from frequencies near DC, i.e., baseband, to a degenerating impedance, $Z_d(S)$ centered at a frequency $f_{CENTER}$. The frequency $f_{CENTER}$ may be at or near the center of a passband. Mathematically, the relationship of the translated or degenerating impedance, $Z_d(s)$ to $Z_1(s)$ can be approximated by:

$$Z_d(s) = Z_1(s - 2\cdot\pi\cdot f_{CENTER}) \qquad \text{EQ. 16}$$

FIG. 3B shows a compact symbol for an exemplary quadrature passive mixer filter (QPMF) 350. The degenerating impedance, $Z_d(s)$, between terminals 302 and 304 of FIG. 3A is the same degenerating impedance, $Z_d(s)$, shown in FIG. 3B. The inphase channel impedance $Z_{1I}$ 318 and the quadrature channel impedance $Z_{1Q}$ 328 of FIG. 3A are shown symbolically as a single impedance $Z_1(s)$ in FIG. 3B for the cases in which $Z_{1I}$ 318 and $Z_{1Q}$ 328 are approximately equal.

Figure 4:
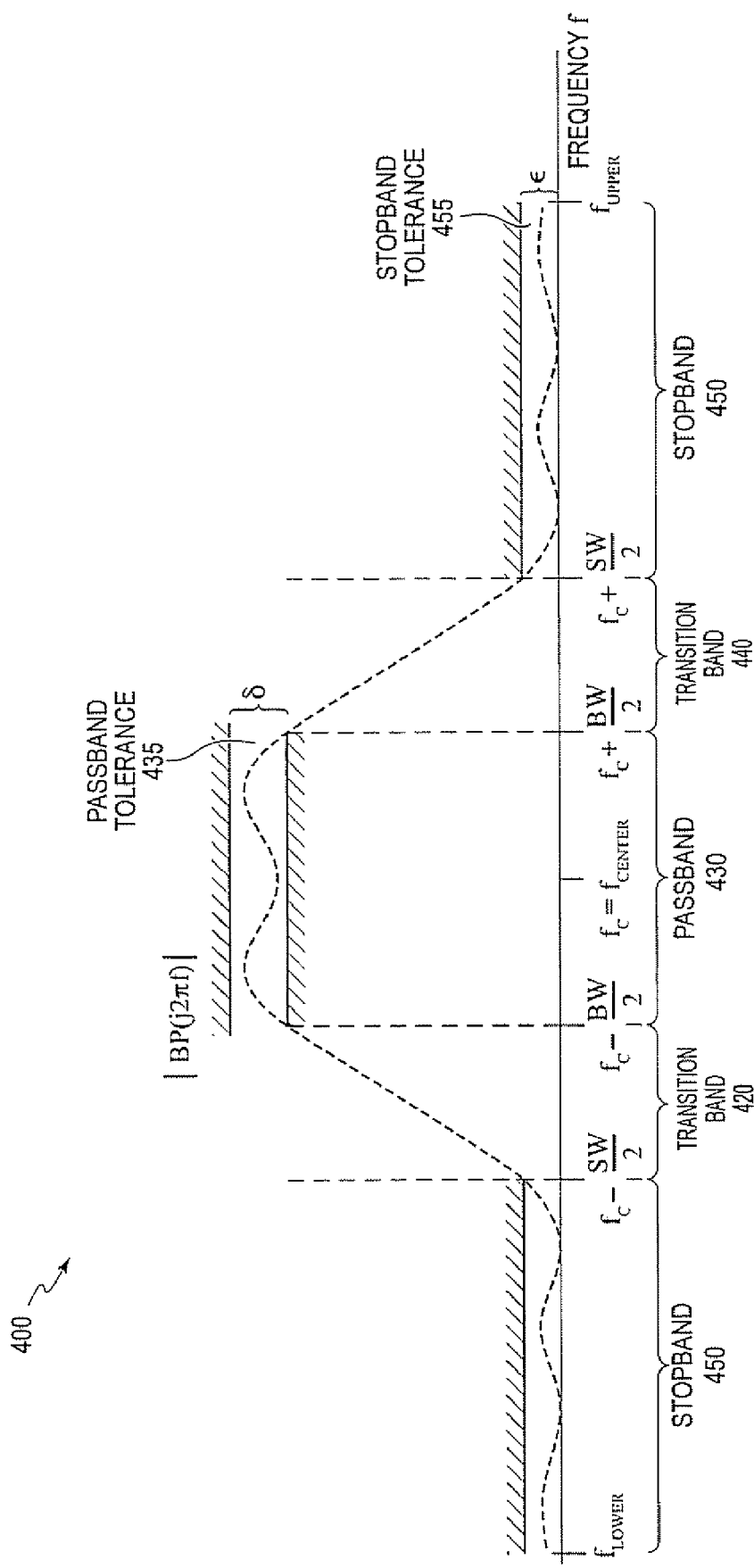
FIG. 4 shows a diagram of an exemplary bandpass filter characteristic.

FIG. 4 is a diagram of an exemplary bandpass filter characteristic 400 showing two stopbands 410 and 450, two transition bands 420 and 440, a passband 430, a passband tolerance mask 435, and a stopband tolerance mask 455. The passband 430 and stopband 410 and 450 bandwidths can be denoted by BW and SW, where BW<SW. The passband 430 can be centered on a frequency $f_{CENTER}$ so the passband 430 extends from $f_{CENTER}$–BW/2 to $f_{CENTER}$+BW/2. The stopbands 410 and 450 can extend to frequencies between $f_{LOWER}$ to $f_{CENTER}$–SW/2 and to frequencies from $f_{CENTER}$+SW/2 to $f_{UPPER}$, respectively. The $f_{LOWER}$ frequency can be DC, i.e. zero Hertz, or a positive frequency. The $f_{UPPER}$ frequency can be infinite, or a finit limit set by the semiconductor technology, system requirements, signal multiplexing or channel spacing, and the like. The ordinate of FIG. 4 can be labeled |BP(j2πf)| to indicate the magnitude of a bandpass (BP) characteristic.

The exemplary bandpass filter characteristic 400 can allow tradeoffs in the widths of the transition bands 420 and 440 in response to a different passband 430 widths, values of passband tolerance mask 435 parameter δ, and values of stopband tolerance mask 455 parameter ϵ. In other words, the roll-off rates of the passband 430 may depend on an adjustable or tunable set of parameters. The ϵ parameter can reduce the attenuation of interfering signals, such as blockers. The passband 430 bandwidth can be chosen to be large enough to prevent or reduce group delay distortion, amplitude modulation (AM) to phase modulation (PM) conversion, and PM to AM conversion in the signal of interest (SOI). The passband 430 can be chosen to be small enough to significantly attenuate deleterious effects from interferers and noise in a stopband. Alternative tradeoffs in the filter parameters can allow reductions in noise power spectral density, improve the transient response, such as by minimizing the peak or undershoot in the time domain, improve ringdown characteristics, etc.

The design of an overall filter characteristic, such as the bandpass filter characteristic 400, can obey the following relation:

$$|g_T(j2\cdot\pi\cdot f)|^2 \le \varepsilon \cdot g_{PEAK} \ \text{for} |f - f_{CENTER}| \ge \frac{SW}{2} \qquad \text{EQ. 17}$$

where ϵ is an attenuation parameter, SW is a stop-width or an inter-stopband bandwidth, which can equal the passband bandwidth, BW, plus two transition band bandwidths. In an exemplary case, ϵ can be less than 0.1 $g_{PEAK}$ (–10 dB).

The transconductance transfer function, $g_T(s)$, can be peaked at approximately $f_{CENTER}$ provided there is a relative maximum in the function. The first derivative can show there is an extremum at $f_{CENTER}$, viz:

$$\left.\frac{d|g_T(j2\cdot\pi\cdot f)|^2}{df}\right|_{f=f_{CENTER}} = 0 \qquad \text{EQ. 18}$$

and the second derivative can show the extremum at $f_{CENTER}$ is a local maximum.

$$\left.\frac{d^2|g_T(j2\cdot\pi\cdot f)|^2}{df^2}\right|_{f=f_{CENTER}} < 0 \qquad \text{EQ. 19}$$

Other criteria can be applied to the overall transconductance transfer function, $g_T(s)$, to determine the vector of filter parameters. In particular, the group delay of $g_T$ can be constrained to be approximately constant within a given range of delays over the passband.

Figure 5:
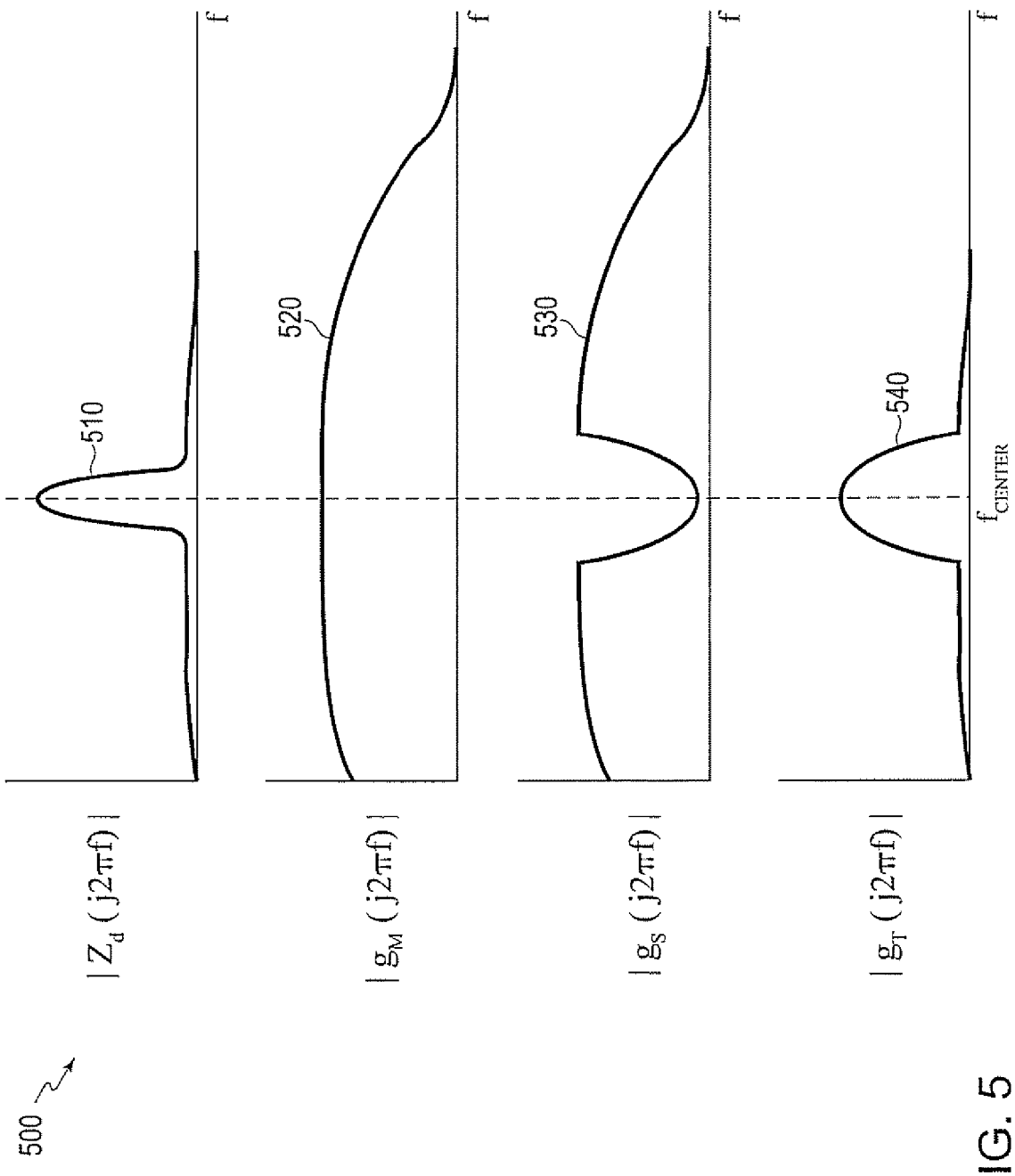
FIG. 5 shows a diagram of an exemplary passband transconductance frequency response.

FIG. 5 shows a diagram of an exemplary passband transconductance frequency response 500. FIG. 5 depicts the magnitudes of the frequency dependence of an impedance $Z_d$ 510, a minuend amplifier transconductance 520, a subtrahend amplifier transconductance 530, and an overall transconductance 540. The impedance $Z_d$ may have a passband filter characteristic, such as the passband filter characteristic 400, and may degenerate the gain of a subtrahend transconductance amplifier, such as subtrahend transconductance amplifier 120.

The minuend amplifier transconductance 520 can be broadband, as depicted, with a broadband roll-off or cut-off frequency larger than an upper edge of a passband, such as the upper edge of passband filter characteristic 400. The frequency response of subtrahend amplifier transconductance 530 can substantially match that of the minuend amplifier transconductance 520 except for a band of frequencies that corresponds to the passband of the degenerating impedance $Z_d$ 510. When a summing circuit, such as summing circuit 130 sums the currents from the minuend and subtrahend transconductance amplifiers, the frequency response of the total or overall transconductance may have a passband corresponding to, but not necessarily the same width as, the passband of the degenerating impedance $Z_d$ 510.

Figure 6:
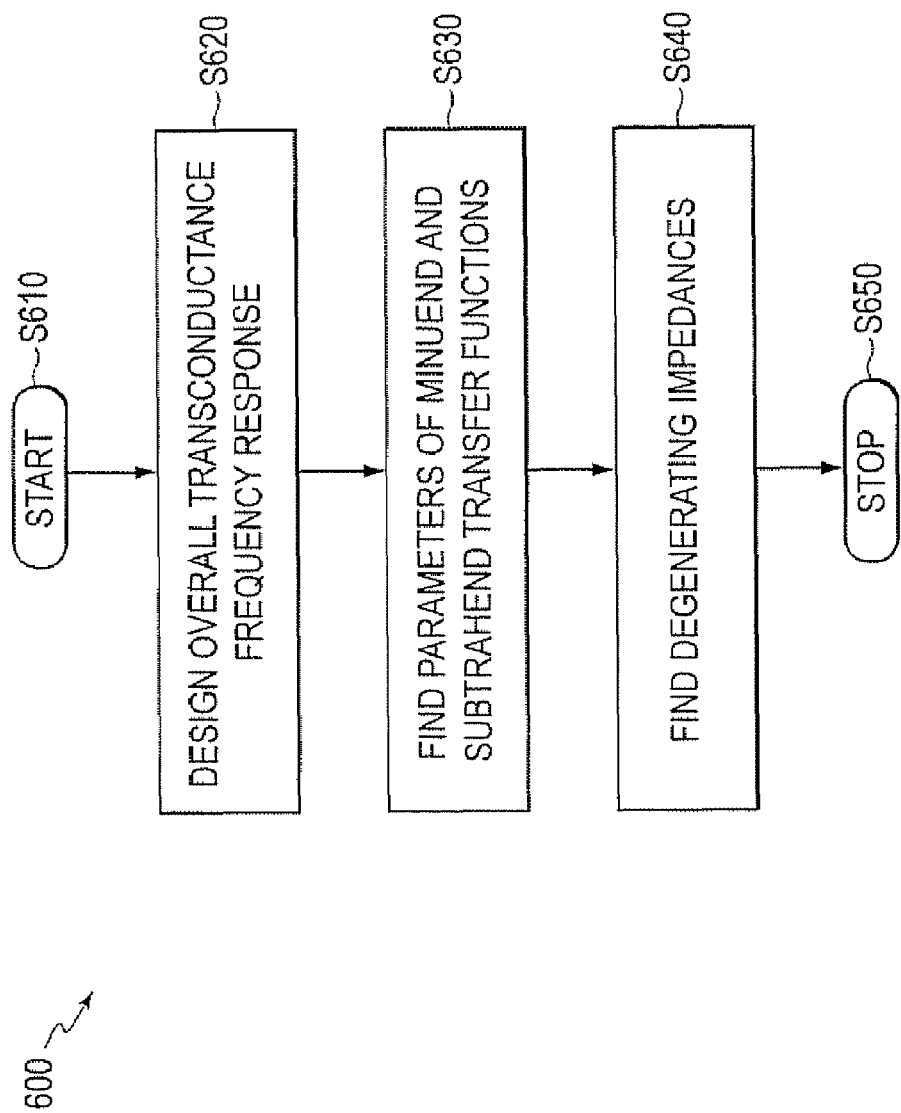
FIG. 6 shows a diagram of an exemplary flowchart of the tunable RF bandpass transconductance amplifier design method.

FIG. 6 shows a diagram of an exemplary flowchart of the tunable RF bandpass transconductance amplifier design process 600. The design process can start with step S610 and can proceed to step S620 in which the overall transconductance frequency response is determined. The overall transconductance frequency response can be established by using an analytical bandpass transfer function, a Chebyschev function, a Caur function, an equi-ripple characteristic, and the like. The overall transconductance frequency response can be established by system requirements which include analyses of the effects of noise, interferers, such as blockers, image frequency components, cross modulation and self modulation susceptibility, and the like. Alternatively, the overall transconductance frequency response can be established by measurement.

From step S620 the program flow can continue to step S630 in which the parameters of the minuend and subtrahend transfer functions are found. Parameter estimation techniques for finding the parameters of the minuend and subtrahend transfer functions include least squares, adaptive filters, Kalman filters, conjugate gradient, simulated annealing, and the like.

From step S630, program flow can continue to step S640 in which the degenerating impedances are found. The degenerating impedances can be found by an algebraic manipulation of the minuend and subtrahend transfer functions. The degenerating impedances can include compensating impedances that compensate for the ON resistance of clocked switches. The degenerating impedances can implement resistive elements using triode biased MOSFETS. From step S640 program flow can proceed to step S650 where the program can stop.

Figure 7:
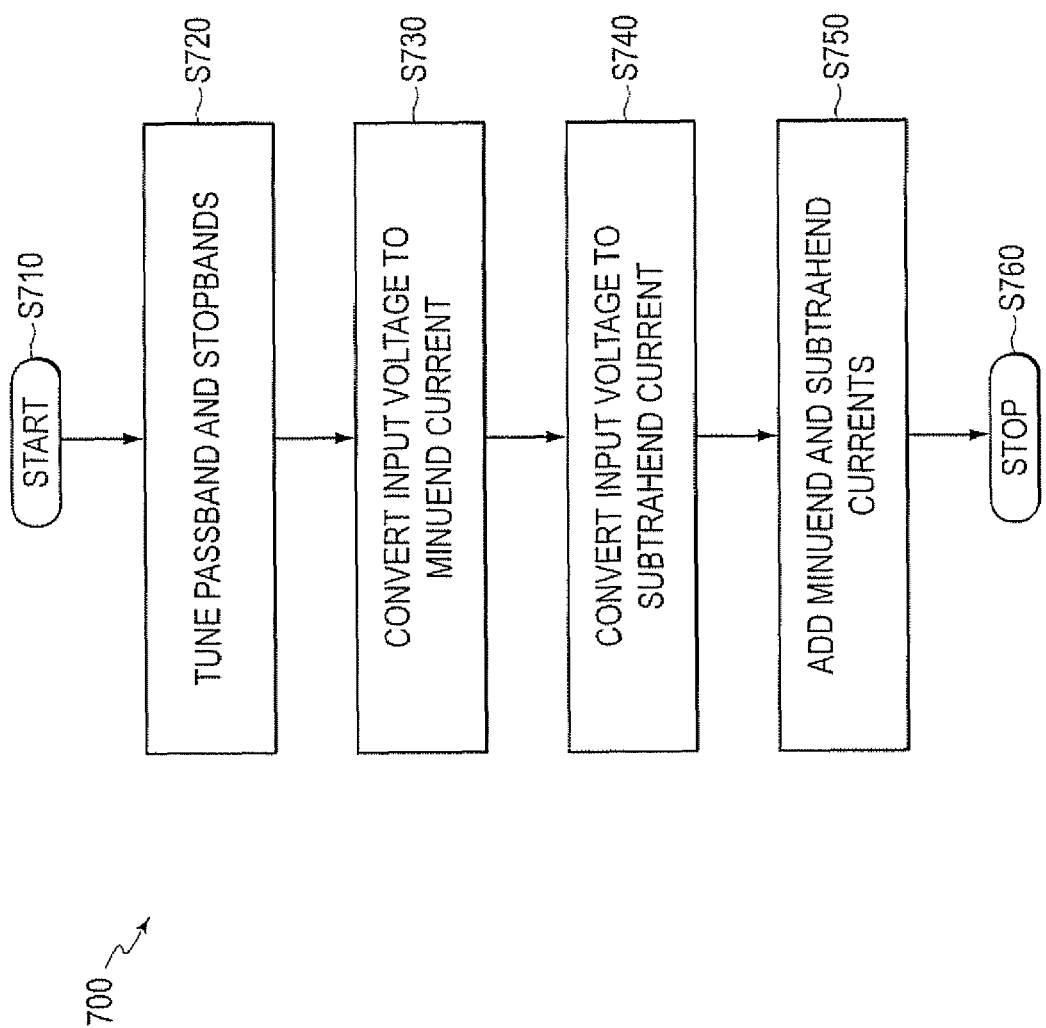
FIG. 7 shows a diagram of an exemplary flowchart of the tunable RF bandpass transconductance amplifier method.

FIG. 7 shows a diagram of an exemplary flowchart of the tunable RF bandpass transconductance amplifier method 700. Program flow can begin at step S710 and proceed to step S720, in which a passband may be tuned to a frequency, such as $f_{CENTER}$. The passband may be tuned by upconverting a baseband impedance to a degenerating passband impedance, such as a degenerating passband impedance that degenerates a subtrahend transconductance amplifier.

Program flow can proceed from step S720 and can proceed to step S730, in which the input voltage may be converted to a minuend current. The minuend current may have an antiphase relationship and substantially the same amplitude as a subtrahend current in a first and a second stopband that flank a passband. In other words, the passband can be interposed between the stopbands.

The antiphase relationship of minuend and subtrahend currents in the stopbands can cause a substantial cancellation of the sum of the minuend current and the subtrahend current. The minuend current may or may not have an antiphase relationship with the subtrahend current in the passband. More complex phase relationships in the passband can generate matched filters, band-splitting filters, and the like.

After step S730, program flow can proceed to step S740 in which the input voltage may be converted to a subtrahend current. The polarity of the input voltage may be inverted or negated so the subtrahend current may be added to the minuend current rather than being subtracted from the minuend current to substantially cancel current in a frequency band.

After step S740, program flow can proceed to step S750 in which the minuend current is added to the subtrahend current. The addition of two currents of opposite polarity has the effect of subtracting the two currents.

After step S750, program flow can proceed to step S760 where program execution can stop.

While this disclosure has been described in conjunction with the specific exemplary embodiments thereof, it is evident that many alternatives, modifications, and variations will be apparent to those skilled in the art. Accordingly, embodiments of the disclosure as set forth herein are intended to be illustrative, not limiting. There are changes that can be made without departing from the spirit and scope of the invention.

What is claimed is:

1. A bandpass transconductance amplifier comprising:
  a minuend transconductance amplifier that is configured to convert a voltage signal to a first current;
  a subtrahend transconductance amplifier that is configured to convert the voltage signal to a second current, the second current having substantially a same amplitude as the first current, but opposite polarity, over a first stopband and a second stopband, and the second current having a smaller amplitude than the first current within a passband;
  a controller that is configured to tune the passband and the first and second stopbands; and
  a summing circuit that is configured to add the first current and the second current.

2. The amplifier of claim 1, further comprising:
  a first degenerating impedance that is configured to degenerate a transconductance of the subtrahend transconductance amplifier.

3. The amplifier of claim 2, further comprising:
  a second degenerating impedance that is configured to degenerate a transconductance of the minuend transconductance amplifier.

4. The amplifier of claim 3, wherein the second degenerating impedance attenuates an output current in the first stopband relative to the second stopband.

5. The amplifier of claim 1, wherein the minuend transconductance amplifier and the subtrahend transconductance amplifier are MOSFET amplifiers.

6. The amplifier of claim 2, wherein the first degenerating impedance is a quadrature passive mixer filter.

7. The amplifier of claim 6, wherein the quadrature passive mixer filter further comprises:
  a baseband impedance that is configured to attenuate frequencies above a lowpass roll-off frequency; and
  a set of mixer switches that are configured to upconvert the baseband impedance to a tuned passband impedance, the mixer switches each having an ON resistance.

8. The amplifier of claim 7, wherein the baseband impedance is one of a parallel circuit containing a first resistor and a capacitor, and a parallel circuit containing the first resistor and a series circuit containing the capacitor and a second resistor.

9. The amplifier of claim 1, wherein an output current of the summing circuit over the first and second stopbands is at least 10 dB smaller than the output current in the passband.

10. The amplifier of claim 1, wherein the first current is substantially inphase with the second current over the passband.

11. The amplifier of claim 2, wherein the second current is more than 10 dB smaller than the first current over the passband.

12. The amplifier of claim 7, wherein the second degenerating impedance substantially matches the ON resistance of the mixer switches in the passband.

13. The amplifier of claim 6, wherein the minuend transconductance amplifier and the subtrahend transconductance amplifier are differential pair transistor amplifiers.

14. A bandpass transconductance amplifier comprising:
a controller configured to tune a passband, a first stopband, and a second stopband;
a minuend transconductance amplifier that is configured to convert a voltage signal to a first current;
a subtrahend transconductance amplifier that is configured to convert the voltage signal to a second current, the second current having substantially a same amplitude as the first current, but opposite polarity, over the first stopband and the second stopband, the second current having a smaller amplitude than the first current within a passband;
a first degenerating impedance configured to degenerate the subtrahend transconductance amplifier;
a quadrature passive mixer filter configured to degenerate the minuend transconductance amplifier, the quadrature passive mixer filter further comprising:
a baseband impedance that is configured to attenuate frequencies above a roll-off frequency; and
a set of mixer switches that are configured to translate the baseband channel impedance to a tuned passband impedance, the tuned passband impedance having substantially a same spectral shape as the baseband impedance; and
a summing circuit configured to add the first and second currents.

15. A method for bandpass amplification comprising:
converting a voltage signal to a first current;
converting the voltage signal to a second current, the second current having substantially a same amplitude as the first current, but opposite polarity, over a first stopband and a second stopband, the second current having a substantially smaller amplitude than the first current within a passband;
tuning the passband and the first and second stopbands; and
adding the first current and the second current to generate an output current.

16. The method of claim 15, further comprising:
degenerating the transconductance of a subtrahend transconductance amplifier having a subtrahend transconductance amplifier source current.

17. The method claim 16, further comprising:
degenerating the transconductance of a minuend transconductance amplifier having a minuend transconductance amplifier source current.

18. The method claim 17, wherein degenerating the transconductance of the minuend transconductance amplifier attenuates the output current in the first stopband relative to the second stopband.

19. The method of claim 17, wherein degenerating the subtrahend transconductance amplifier reduces the transconductance of the subtrahend transconductance amplifier by a negative feedback from a quadrature passive mixer filter.

20. The method of claim 19, wherein the negative feedback from a quadrature passive mixer filter further comprises:
upconverting a baseband impedance to a tuned passband impedance based on a clock signal, the tuned passband impedance having substantially a same spectral shape as the baseband impedance; and
cross-coupling a portion of a minuend transconductance amplifier source current and a subtrahend transconductance amplifier source current through the tuned passband impedance to generate the negative feedback.

21. The method of claim 15, wherein the output current in the first and second stopbands is at least 10 dB smaller than the output current in the passband.

22. The method of claim 15, wherein the first current is substantially inphase with the second current over the passband.

23. The method claim 16, wherein degenerating the transconductance of the subtrahend transconductance amplifier reduces a non-linearity of the subtrahend transconductance amplifier within the passband.

24. The method of claim 17, wherein degenerating the minuend transconductance amplifier is substantially matching the degeneration of the subtrahend transconductance amplifier in the stopband.

25. A method of bandpass amplification comprising:
converting a voltage signal to a first current;
converting the voltage signal to a second current using a tunable subtrahend transconductance amplifier, the second current having substantially a same amplitude as the first current, but opposite polarity, over a first stopband and a second stopband, and the second current having a substantially smaller amplitude than the first current within a passband;
tuning the passband and the stopbands by tuning a tunable subtrahend transconductance amplifier based on a clock signal; and
adding the first and second currents to generate an output current.

* * * * *